(12) United States Patent
Hwang et al.

(10) Patent No.: US 8,037,389 B2
(45) Date of Patent: Oct. 11, 2011

(54) METHOD AND APPARATUS TO DATA ENCODE AND DECODE, STORAGE MEDIUM HAVING RECORDED THEREON PROGRAM TO IMPLEMENT THE METHOD, AND SYSTEM TO DRIVE THE STORAGE MEDIUM

(75) Inventors: Sung-hee Hwang, Suwon-si (KR); Jung-wan Ko, Suwon-si (KR); Hyun-jeong Park, Suwon-si (KR); Joon-hwan Kwon, Suwon-si (KR); Hyun-kwon Chung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1329 days.

(21) Appl. No.: 11/641,859

(22) Filed: Dec. 20, 2006

(65) Prior Publication Data
US 2007/0245215 A1    Oct. 18, 2007

(30) Foreign Application Priority Data

Apr. 3, 2006  (KR) .................. 10-2006-0030268
Jul. 7, 2006   (KR) .................. 10-2006-0064014

(51) Int. Cl.
*H03M 13/00* (2006.01)
(52) U.S. Cl. .................. 714/758; 714/759; 714/778
(58) Field of Classification Search .................. 714/758, 714/755, 759, 763, 778, 704, 6
See application file for complete search history.

(56) References Cited

U.S. PATENT DOCUMENTS

| | | | |
|---|---|---|---|
| 5,477,551 A * | 12/1995 | Parks et al. .................. | 714/758 |
| 7,340,665 B2 * | 3/2008 | Tsang .......................... | 714/766 |
| 7,401,268 B2 * | 7/2008 | Noda et al. .................. | 714/701 |
| 7,530,003 B2 * | 5/2009 | Lee et al. .................... | 714/759 |
| 2004/0250198 A1 | 12/2004 | Shim et al. | |
| 2005/0025022 A1 | 2/2005 | Nakagawa | |
| 2005/0254387 A1 | 11/2005 | Kojima et al. | |
| 2006/0062122 A1 | 3/2006 | Winter et al. | |

OTHER PUBLICATIONS

Search Report Issued on Apr. 30, 2007 by the International Searching Authority for PCT International Application No. PCT/KR2007/001167.

* cited by examiner

*Primary Examiner* — Fritz Alphonse
(74) *Attorney, Agent, or Firm* — NSIP Law, PC

(57) ABSTRACT

A method of and apparatus to data encode and decode for improving the reliability of data that is compatible with a conventional error correction code (ECC) block format, a storage medium, a system to drive the storage medium, and a method of generating an extra parity ECC block, the data encoding method including generating N number of ECC blocks with respect to user data and generating at least one extra parity ECC block for the generated N number of ECC blocks.

42 Claims, 15 Drawing Sheets

METHOD AND APPARATUS TO DATA ENCODE AND DECODE, STORAGE MEDIUM HAVING RECORDED THEREON PROGRAM TO IMPLEMENT THE METHOD, AND SYSTEM TO DRIVE THE STORAGE MEDIUM

CROSS-REFERENCE TO RELATED APPLICATIONS

This application claims the benefits of Korean Patent Application No. -2006-30268, filed on Apr. 3, 2006, and Korean Patent Application No. -2006-64014, filed on Jul. 7, 2006, in the Korean Intellectual Property Office, the disclosures of which are incorporated herein in their entirety by reference.

BACKGROUND OF THE INVENTION

1. Field of the Invention

Aspects of the present invention relate to data encoding and decoding, and more particularly, to a method and apparatus to data encode and decode based on an error correction code (ECC) block, a storage medium having recorded thereon a program to implement the method, and a system to drive the storage medium.

2. Description of the Related Art

A system to drive a storage medium, such as a hard disk, a digital versatile disc (DVD), a high definition DVD (HD-DVD), or a Blu-ray disc, performs error correction code (ECC) block-based error correction for burst errors (such as physical scratches or fingerprints on the storage medium) or random errors (such as dust) during data decoding.

However, the performance of ECC block-based error correction of a conventional system to drive a storage medium is defined according to the type of the storage medium. For example, if the storage medium is a DVD, consecutive errors of a length corresponding to about 16 rows (16×182+10 bytes) of an ECC block can be corrected. For a HD-DVD, consecutive errors of a length corresponding to about 32 rows (32×182+10 bytes) of an ECC block can be corrected. For a Blu-ray disc, consecutive errors of a length corresponding to 64 rows (155×64 bytes) of an ECC block can be corrected. The physical length of consecutive errors that can be corrected can be set differently according to a recording density of a storage medium. For example, consecutive errors of approximately 6 mm for a DVD, consecutive errors of approximately 6.4 mm for an HD-DVD, and consecutive errors of approximately 9 mm for a Blu-ray disc can be corrected.

However, as the number of times the storage medium is used increases, degradation of data recorded thereon may occur due to recording or reproducing power and dust, scratches, and fingerprints resulting from management conditions of the storage medium. As a result, the probability that conventional standardized ECC block-based error correction fails increases. In particular, a physical scratch on the surface of the storage medium causes irreparable damage to data recorded thereon, increasing the probability that conventional standardized ECC block-based error correction fails. In the case of a failure in conventional standardized ECC block-based error correction, the reliability of data reproduced from the storage medium driving system decreases.

In an ECC block-based data communication system, the length of consecutive errors included in data may exceed the length of consecutive errors that can be corrected using an ECC block according to a condition like transmission speed. In this case, ECC-block based error correction fails in data decoding, causing transmission data loss. As a result, the reliability of data reproduced from the data communication system decreases.

SUMMARY OF THE INVENTION

Aspects of the present invention provide a method of and apparatus to data encode and decode for improving the reliability of data reproduced using an extra parity ECC block that is compatible with an existing ECC block, and a storage medium having recorded thereon a program to implement the method.

Aspects of the present invention also provide a system to drive a storage medium so as to improve the reliability of data reproduced using an extra parity ECC block that is compatible with an existing ECC block.

Aspects of the present invention also provide a method of generating an extra parity ECC block that is compatible with an existing ECC block in data encoding so as to improve the reliability of reproduced data.

According to an aspect of the present invention, there is provided a data encoding method including generating N number of ECC blocks with respect to user data and generating at least one extra parity ECC block for the generated N number of ECC blocks.

The generating of the at least one extra parity ECC block may include generating N number of extra data blocks by performing block interleaving on user data blocks of adjacent ECC blocks among the generated N number of ECC blocks, generating N number of extra ECC blocks by adding extra parity information to the N number of extra data blocks, and generating the at least one extra parity ECC block based on the extra parity information included in the N number of extra ECC blocks.

The generating of the at least one extra parity ECC block may include generating the N number of extra data blocks by performing block interleaving on the user data blocks of adjacent ECC blocks among the generated N number of ECC blocks, generating the N number of extra ECC blocks by adding the extra parity information to the generated N number of extra data blocks, generating at least N/2 number of first extra parity ECC blocks based on the extra parity information included in the generated N number of extra ECC blocks, and generating at least one second extra parity ECC block by performing block interleaving on the extra parity information included in the at least N/2 number of first extra parity ECC blocks, wherein the at least one second extra parity ECC block is the at least one extra parity ECC block.

The generating of the at least one extra parity ECC block may include generating the N number of extra data blocks based on a portion of data of the N number of ECC blocks, generating the N number of extra ECC blocks by adding the extra parity information to the N number of extra data blocks, and generating the at least one extra parity ECC block based on the extra parity information included in the N number of extra ECC blocks.

The generating of the at least one extra parity ECC block may include generating an extra parity data block by interleaving the extra parity information included in the N number of extra ECC blocks and generating the at least one extra parity ECC block by adding parity information to the extra parity data block.

The generating of the extra parity ECC block may include generating the N number of extra data blocks based on the entire data of the N number of ECC blocks, generating N number of extra ECC blocks by adding extra parity information to the N number of extra data blocks, and generating the at least one extra parity ECC block based on the extra parity information included in the N number of extra ECC blocks.

The generating of the at least one extra parity ECC block may include generating the extra parity data block by interleaving the extra parity information included in the N number of extra ECC blocks and generating the extra parity ECC block by adding parity information to the extra parity data block.

According to another aspect of the present invention, there is provided a method of generating an extra parity error correction code (ECC) block, the method including generating N number of extra data blocks using N number of ECC blocks, generating N number of extra ECC blocks by adding extra parity information to the N number of extra data blocks, and generating at least one extra parity ECC block corresponding to the N number of ECC blocks based on the extra parity information included in the N number of extra ECC blocks.

According to yet another aspect of the present invention, there is provided a data encoder including an error correction code (ECC) block generating unit that generates N number of ECC blocks for user data and an extra parity ECC block generating unit that generates at least one extra parity ECC block for the generated N number of ECC blocks.

According to still another aspect of the present invention, there is provided a system to drive a storage medium, the system including a data encoding unit that generates N number of error correction code (ECC) blocks for user data and generates at least one extra parity ECC block for the N number of ECC blocks and a storage medium that stores the N number of ECC blocks and the at least one extra parity ECC block generated by the data encoding unit.

According to another aspect of the present invention, there is provided a data decoding method including generating N number of extra error correction code (ECC) blocks using an extra parity data block included in an extra parity ECC block and user data blocks of N number of ECC blocks, performing error correction on the N number of extra ECC blocks, updating a user data block of an ECC block based on extra data blocks included in the N number of extra ECC blocks that have undergone error correction, and performing error correction on the ECC block having the updated user data block.

According to yet another aspect of the present invention, there is provided a data decoder including an extra error correction code (ECC) block generating unit that generates N number of extra ECC blocks using an extra parity data block included in an extra parity ECC block and user data blocks of N number of ECC blocks, an error correcting unit that performs error correction on the N number of extra ECC blocks, and an updating unit that updates a user data block of an ECC block based on extra data blocks included in the N number of extra ECC blocks that have undergone error correction.

According to another aspect of the present invention, there is provided a system to drive a storage medium, the system including a storage medium that stores N number of error correction code (ECC) blocks and at least one extra parity ECC block corresponding to the N number of ECC blocks, an ECC block recovering unit that recovers an ECC block based on the ECC blocks and the extra parity ECC blocks read from the storage medium, and an ECC block error correcting unit that performs error correction on an ECC block transmitted from one of the storage medium and the ECC block recovering unit.

According to another aspect of the present invention, there is provided a computer-readable storage medium including N number of error correction code (ECC) blocks and at least one extra parity ECC block for recovering the N number of ECC blocks.

According to still another aspect of the present invention, there is provided a computer-readable storage medium having recorded thereon a program to implement a data encoding method, the computer-readable storage medium including a code to generate N number of ECC blocks for user data and a code to generate at least one extra ECC block for the N number of ECC blocks.

According to another aspect of the present invention, there is provided a computer-readable storage medium having recorded thereon a program to implement a data decoding method, the computer-readable storage medium including a code to generate N number of extra error correction code (ECC) blocks based on an extra parity data block of an extra parity ECC block and user data blocks of N number of ECC blocks, a code to perform error correction on the N number of extra ECC blocks, a code to update a user data block of an ECC block based on extra data blocks included in the N number of extra ECC blocks that have undergone error correction, and a code to perform error correction on the ECC block having the updated user data block.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
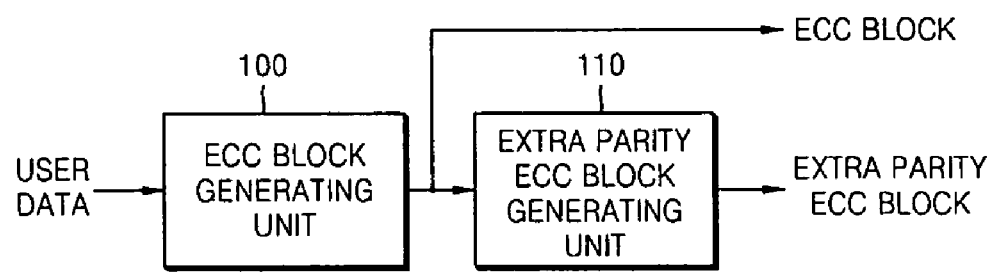
FIG. 1 is a schematic block diagram of a data encoder according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a schematic block diagram of a data encoder according to an embodiment of the present invention. Referring to FIG. 1, the data encoder includes an ECC block generating unit 100 and an extra parity ECC block generating unit 110.

The ECC block generating unit 100 generates N number of ECC blocks with respect to user data. In other words, if the ECC block generating unit 100 generates N number of ECC blocks, each of which has a length of 32 Kilobytes (KB), the ECC block generating unit 100 adds additional information, such as an address and an error detection code, (EDC) to the ECC block, scrambles the user data, and then adds a parity for error correction to the ECC block. The user data may be received from a host (not shown) when the data encoder is applied to a system to drive a storage medium (not shown) or received through a network or a wired and/or wireless communication system when the data encoder is applied to a data communication system.

The extra parity ECC block generating unit 110 generates at least one extra parity ECC block including extra parity information for the generated N number of ECC blocks.

Figure 2:
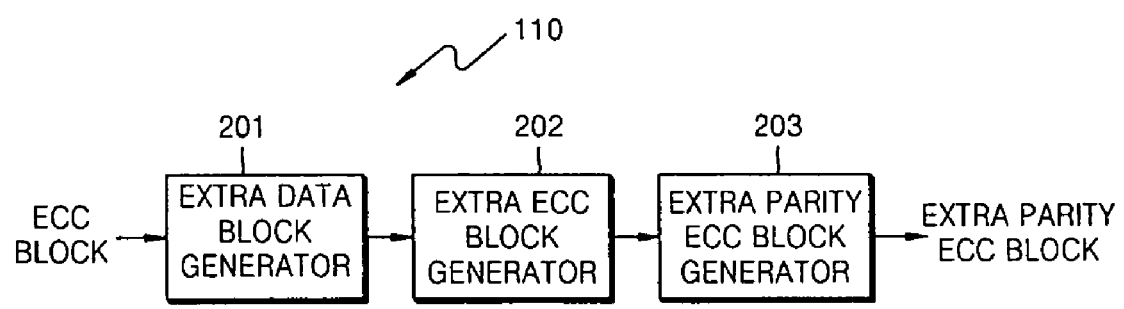
FIG. 2 is a block diagram of an extra parity ECC block generating unit of FIG. 1 according to an embodiment of the present invention.

FIG. 2 is a block diagram of an extra parity ECC block generating unit 110 according to an embodiment of the present invention. Referring to FIG. 2, the extra parity ECC block generating unit 110 includes an extra data block generator 201, an extra ECC block generator 202, and an extra parity ECC block generator 203.

The extra data block generator 201 performs block interleaving on user data blocks of adjacent ECC blocks among the generated N number of ECC blocks in order to generate N number of extra data blocks. The operation of the extra data block generator 201 will now be described in more detail with reference to FIG. 3.

Figure 3:
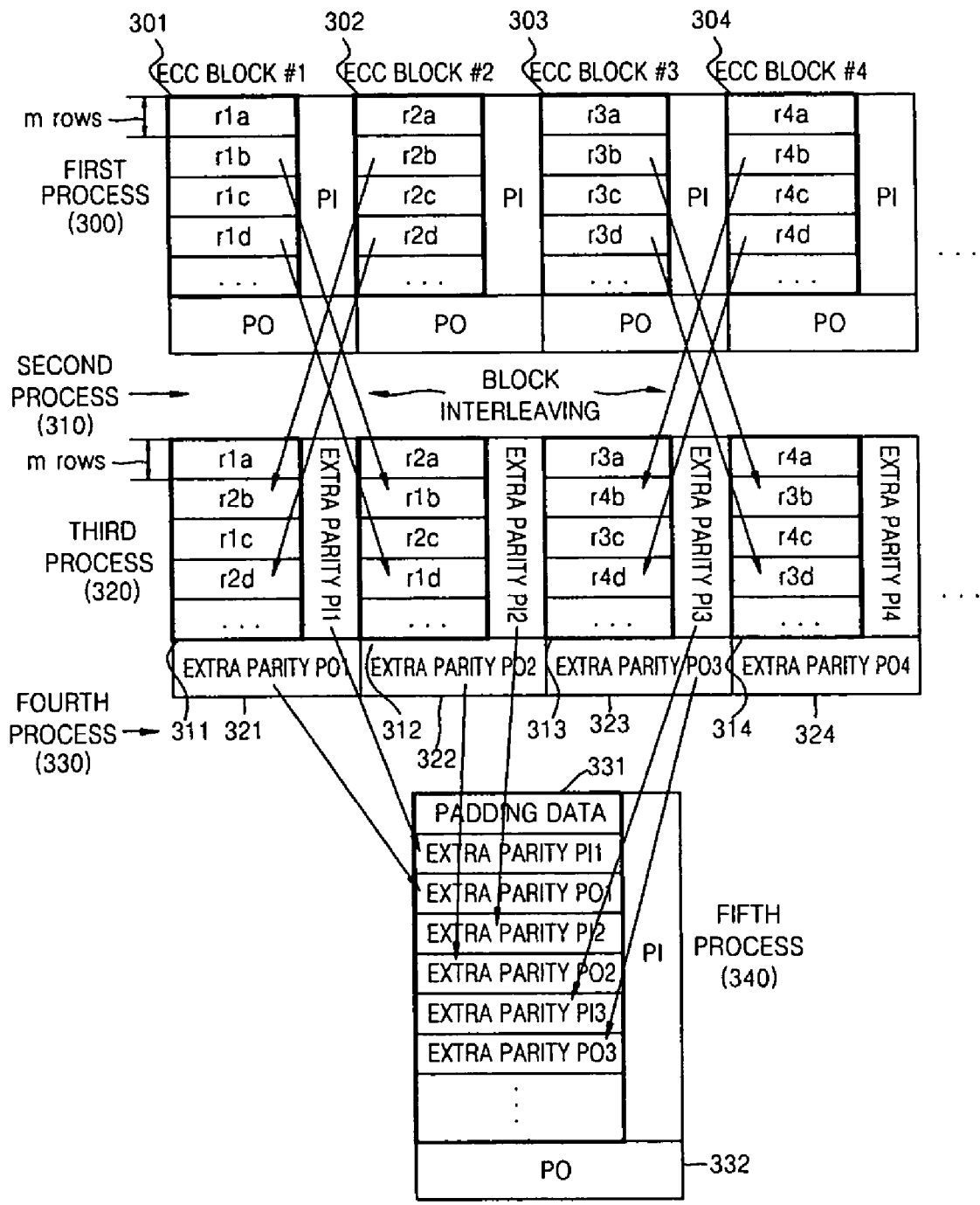
FIG. 3 is a view explaining an extra parity ECC block generating process based on FIG. 2 according to an embodiment of the present invention.

FIG. 3 is a view explaining an extra parity ECC block generating process based on FIG. 2 according to an embodiment of the present invention. The extra data block generator 201 performs block interleaving on user data blocks 301, 302, 303, 304 of adjacent ECC blocks among the N number of ECC blocks (ECC blocks #1 through #N) of a first process 300 in a second process 310. For example, the extra data block generator 201 performs block interleaving on user data blocks 301 and 302 included in the ECC block #1 and the ECC block #2. The block interleaving is performed in units of at least one row. Thus, in FIG. 3, m number of rows is an integer that is greater than 0. N number of extra data blocks 311 through 311+(N−1) are generated by the block interleaving. The generated N number of extra data blocks 311 through 311+(N−1) are transmitted to the extra ECC block generator 202.

In a third process 320, the extra ECC block generator 202 generates N number of extra ECC blocks 321 through 321+(N−1) by adding extra parity information EXTRA PARITY (PI1, PO1) through (PIN, PON) to the N number of extra data blocks 311 through 311+(N−1).

The extra parity ECC block generator 203 generates at least one extra parity ECC block 332 based on the extra parity information EXTRA PARITY (PI1, PO1) through (PIN, PON) included in the N number of extra ECC blocks 321 through 321+(N−1).

Referring to FIG. 3, in a fourth process 330, the extra parity ECC block generator 203 generates an extra parity data block 331 based on the extra parity information EXTRA PARITY (PI1, PO1) through (PIN, PON) included in the N number of extra ECC blocks 321 through 321+(N−1) and padding data. The extra parity ECC block generator 203 generates an extra parity ECC block 332 based on the generated extra parity data block 331 and parity information PI and PO in a fifth process 340. The padding data is added to match the format of the extra parity ECC block 332 with an existing standardized ECC block format. The extra parity ECC block 332 is an extra parity ECC block for the N number of ECC blocks.

Figure 4:
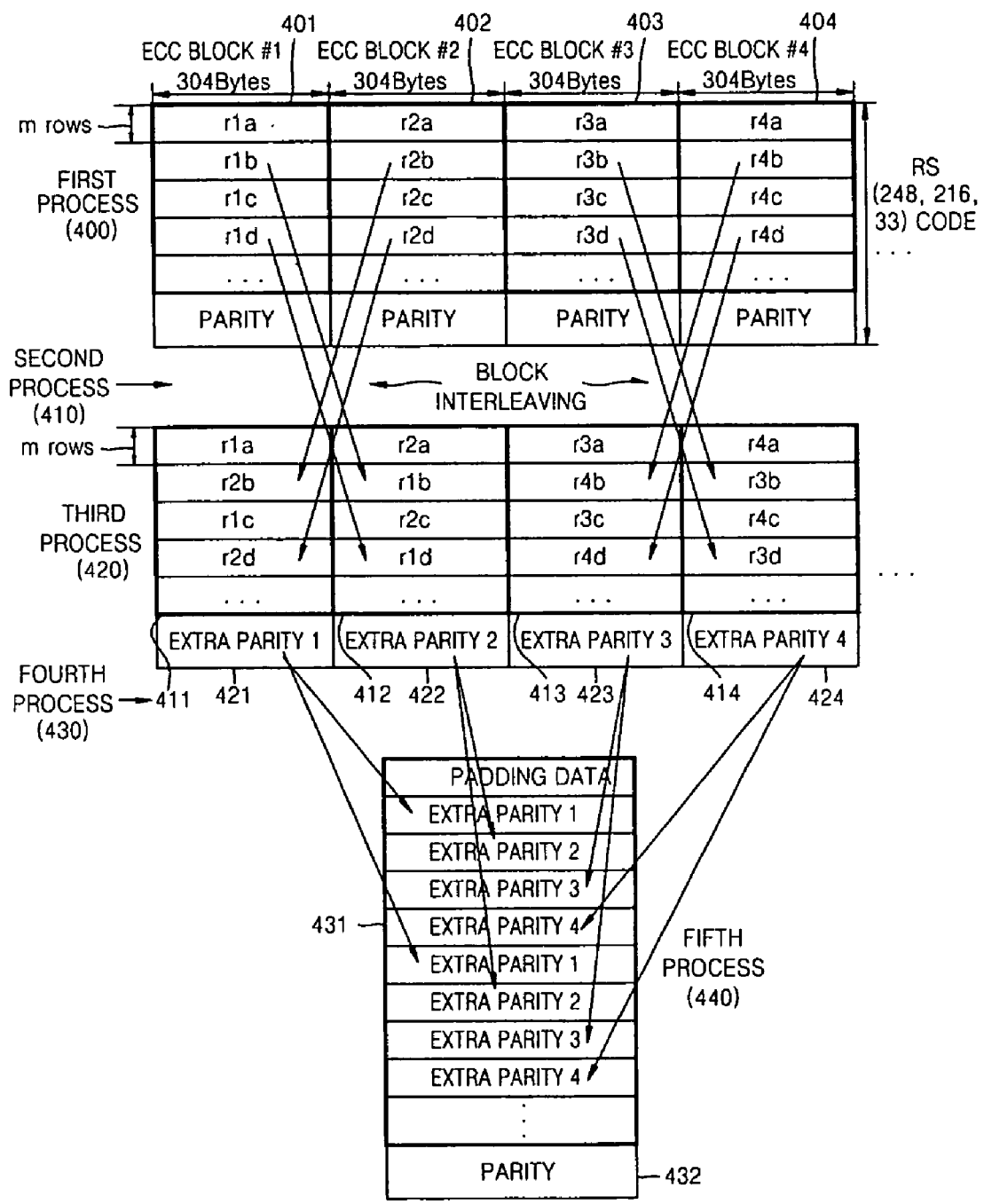
FIG. 4 is a view explaining an extra parity ECC block generating process based on FIG. 2 according to another embodiment of the present invention.

FIG. 4 is a view explaining the extra parity ECC block generating process based on FIG. 2 according to another embodiment of the present invention. The extra data block generator 201 performs block interleaving on user data blocks 401, 402, 403, 404 of adjacent ECC blocks among the N number of ECC blocks (ECC blocks #1 through #N) of a first process 400 in a second process 410. For example, the extra data block generator 201 performs block interleaving on user data blocks 401 and 402 included in the ECC block #1 and the ECC block #2. The block interleaving is performed in units of at least one row. Thus, in FIG. 4, m number of rows is an integer that is greater than 0. N number of extra data blocks 411 through 411+(N−1) are generated by the block interleaving. The generated N number of extra data blocks 411 through 411+(N−1) are transmitted to the extra ECC block generator 202.

In a third process 420, the extra ECC block generator 202 generates N number of extra ECC blocks 421 through 421+(N−1) by adding extra parity information EXTRA PARITY 1 through N to the N number of extra data blocks 411 through 411+(N−1).

The extra parity ECC block generator 203 generates at least one extra parity ECC block 432 for the N number of ECC blocks based on the extra parity information EXTRA PARITY 1 through N included in the N number of extra ECC blocks 421 through 421+(N−1).

Referring to FIG. 4, in a fourth process 430, the extra parity ECC block generator 203 generates an extra parity data block 431 based on the extra parity information EXTRA PARITY 1 through N included in the N number of extra ECC blocks 421 through 421+(N−1) and padding data. The extra parity ECC block generator 203 generates an extra parity ECC block 432 based on the generated extra parity data block 431 and parity information PARITY in a fifth process 440. The padding data is added to match the format of the extra parity ECC block 432 with an existing ECC block format. The extra parity ECC block 432 is an extra parity ECC block for N number of ECC blocks.

Figure 5:
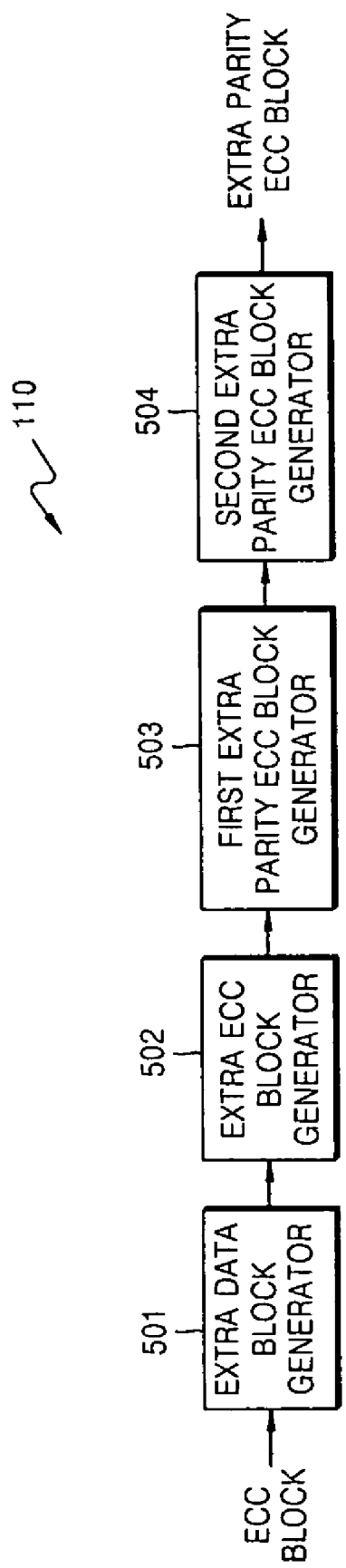
FIG. 5 is a block diagram of an extra parity ECC block generating unit of FIG. 1 according to another embodiment of the present invention.

FIG. 5 is a block diagram of the extra parity ECC block generating unit 110 according to another embodiment of the present invention. Referring to FIG. 5, the extra parity ECC block generating unit 110 includes an extra data block generator 501, an extra ECC block generator 502, a first extra parity ECC block generator 503, and a second extra parity ECC block generator 504.

The extra data block generator 501 performs block interleaving on user data blocks of adjacent ECC blocks among the N number of ECC blocks in order to generate N number of extra data blocks. A process of generating the extra data blocks has already been described in the explanation of the operation of the extra data block generator 201 of FIG. 2.

The extra ECC block generator 502 generates N number of extra ECC blocks based on extra parity information and the generated N number of extra data blocks. A process of generating the N number of extra ECC blocks has already been described in the explanation of the operation of the extra ECC block generator 202 of FIG. 2.

Figure 6:
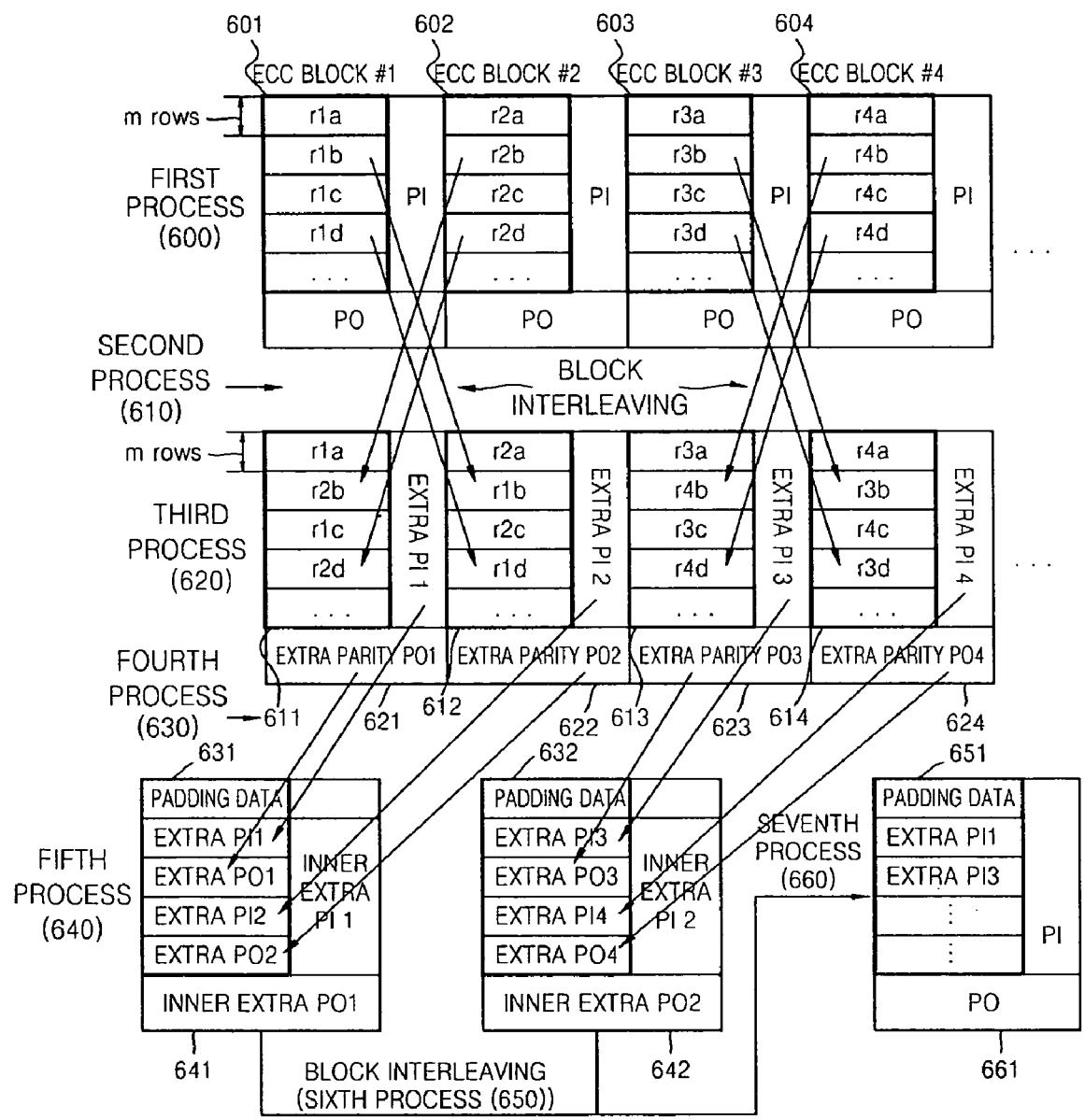
FIG. 6 is a view explaining an extra parity ECC block generating process based on FIG. 5 according to an embodiment of the present invention.

The first extra parity ECC block generator 503 generates at least N/2 number of first extra parity ECC blocks 641 through 641+(N/2−1) based on extra parity information included in the generated N number of extra ECC blocks 621 through 621+(N−1). FIG. 6 is a view explaining an extra parity ECC block generating process based on FIG. 5 according to an embodiment of the present invention.

Referring to FIG. 6, in a fourth process 630, the first extra parity ECC block generator 503 generates N/2 number of extra parity data blocks 631 through 631+(N/2−1) using padding data and extra parity information (PI1, PO1) through (PIN, PON) included in the N number of extra ECC blocks 621 through 621+(N−1). In a fifth process 640, the first extra parity ECC block generator 503 generates N/2 number of first extra parity ECC blocks 641 through 641+(N/2−1) using inner extra parity information INNER EXTRA PI1, PO1, PI2, PO2, . . .

In a sixth process 650, the second extra parity ECC block generator 504 performs block interleaving on the extra parity information included in the N/2 first extra parity ECC blocks 641 through 641+(N/2−1) in order to generate an extra parity data block 651 for a second extra parity ECC block 661. The extra parity data block 651 may include padding data to match the format of the second extra parity ECC block with an existing standardized ECC block format. Next, the second extra parity ECC block generator 504 generates the second extra parity ECC block 661 by adding parity information PI and PO to the generated extra parity data block 651. The generated second extra parity ECC block 661 is an extra parity ECC block for N number of ECC blocks.

Figure 7:
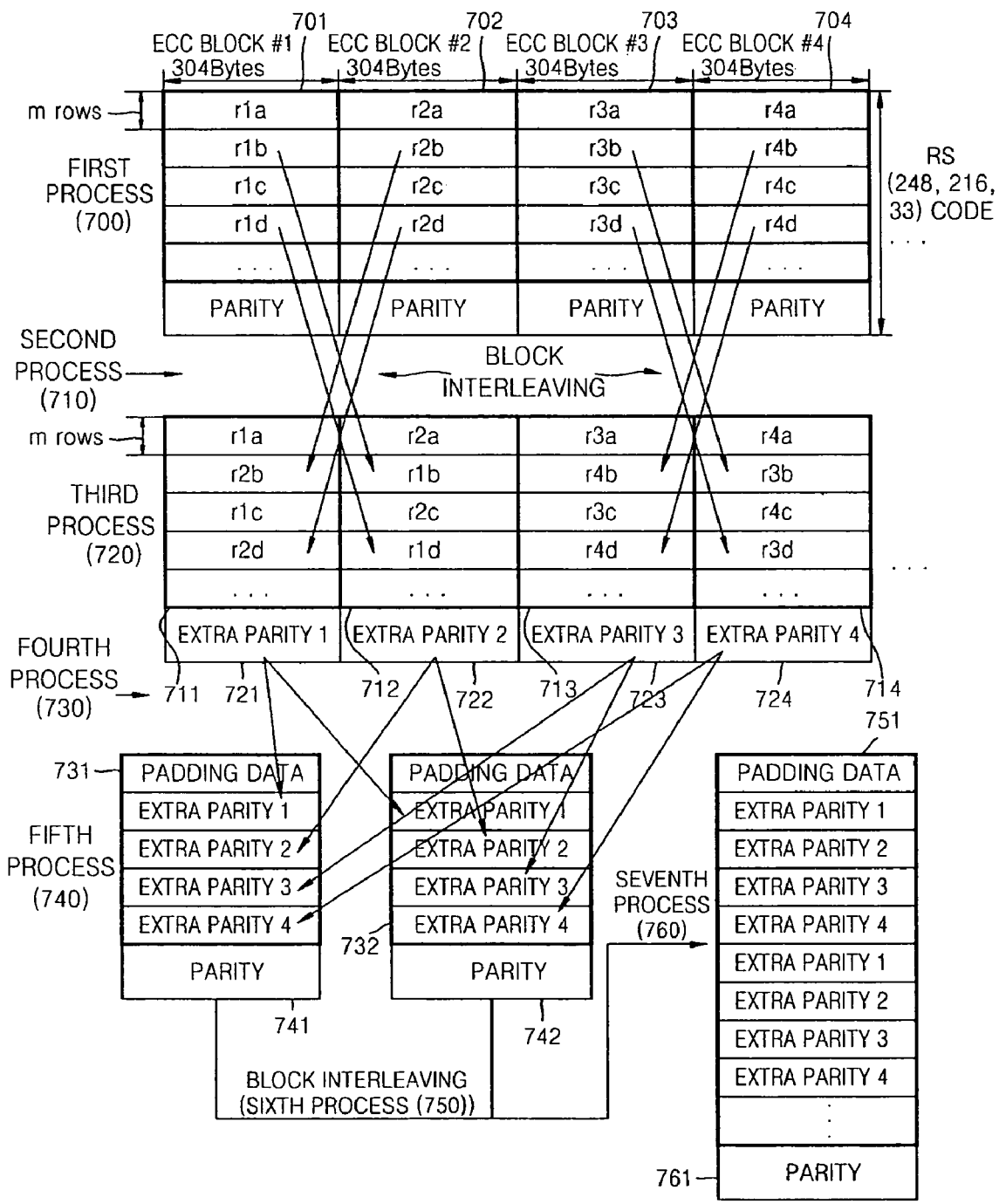
FIG. 7 is a view explaining an extra parity ECC block generating process based on FIG. 5 according to another embodiment of the present invention.

FIG. 7 is a view explaining the extra parity ECC block generating process based on FIG. 5 according to another embodiment of the present invention. In FIG. 7, the extra parity ECC block generating process of FIG. 4 is combined with the extra parity ECC block generating process of FIG. 6 in which extra parity ECC blocks are generated during two stages.

Thus, a first process 700, a second process 710, and a third process 720 are the same as the first process 400, the second process 410, and the third process 420 of FIG. 4. In a fourth process 730, the first extra parity ECC block generator 503 generates N/2 extra parity data blocks 731 through 731+(N/2−1) using padding data and extra parity information EXTRA PARITY 1 through EXTRA PARITY N included in extra ECC blocks 721 through 721+(N−1). Next, in a fifth process 740, the first extra parity ECC block generator 503 generates N/2 first extra parity ECC blocks 741 through 741+(N/2−1) using N/2 parity information PARITY and the generated N/2 extra parity data blocks 731 through 731+(N/2−1).

Next, in a sixth process 750, the second extra parity ECC block generator 504 performs block interleaving on extra parity information included in the generated N/2 number of extra parity data blocks 731 through 731+(N/2−1) in order to generate a second extra parity data block 751. The second extra parity data block 751 may include padding data to match the format of a second extra parity ECC block with an existing ECC block. The second extra parity ECC block generator 504 then generates a second extra parity ECC block 761 by adding parity information PARITY to the generated second extra data block 751. The generated second extra parity ECC block 761 is an extra parity ECC block for N number ECC blocks, as mentioned above.

In FIGS. 3 and 6, the extra parity information includes N number of pairs of extra parity information and N number of ECC blocks which have a Reed Solomon Product Code (RSPC) format, such that the extra ECC blocks and the extra parity ECC blocks are generated according to the RSPC format. In FIGS. 4 and 7, N number of ECC blocks have a BD ECC format, such that the extra ECC blocks and the extra parity ECC blocks are generated according to the BD ECC format. The padding data is a predetermined value and may be substituted by other additional information. The other additional information satisfies a condition that the extra ECC blocks and the extra parity ECC blocks have the same block format as that of the N number of ECC blocks.

Figure 8:
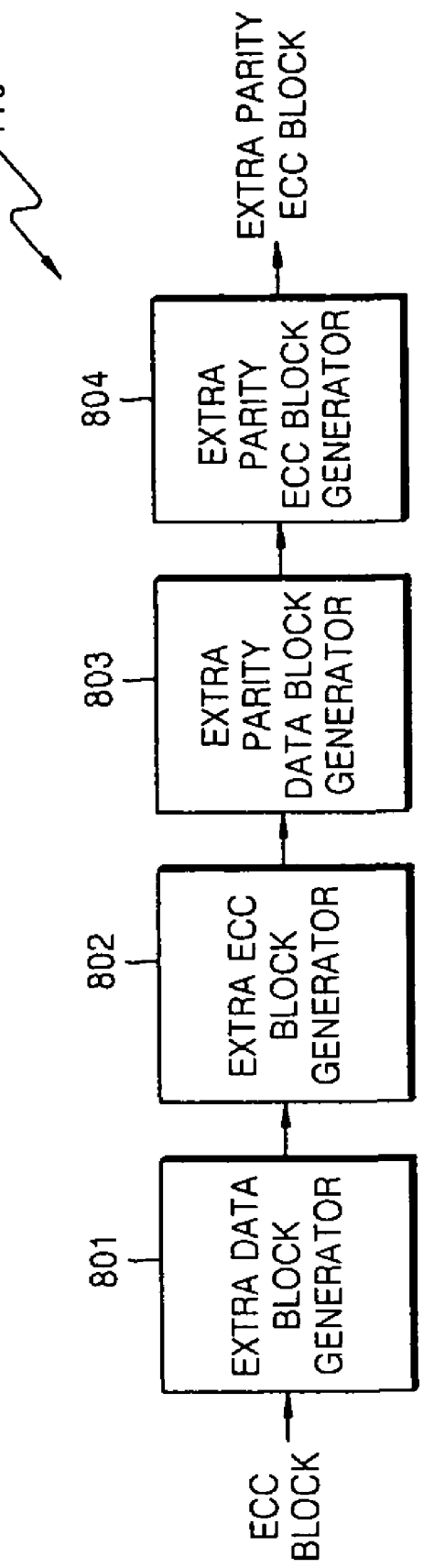
FIG. 8 is a block diagram of an extra parity ECC block generating unit of FIG. 1 according to yet another embodiment of the present invention.

FIG. 8 is a block diagram of the extra parity ECC block generating unit 110 of FIG. 1 according to yet another embodiment of the present invention. Referring to FIG. 8, the extra parity ECC block generating unit 110 includes an extra data block generating unit 801, an extra ECC block generating unit 802, an extra parity data block generating unit 803, and an extra parity ECC block generating unit 804.

The extra data block generating unit 801 generates N number of extra data blocks based on a portion of data of the N number of ECC blocks provided by the ECC block generating unit 100. The operation of the extra data block generating unit 801 will now be described in more detail with reference to FIG. 9.

Figure 9:
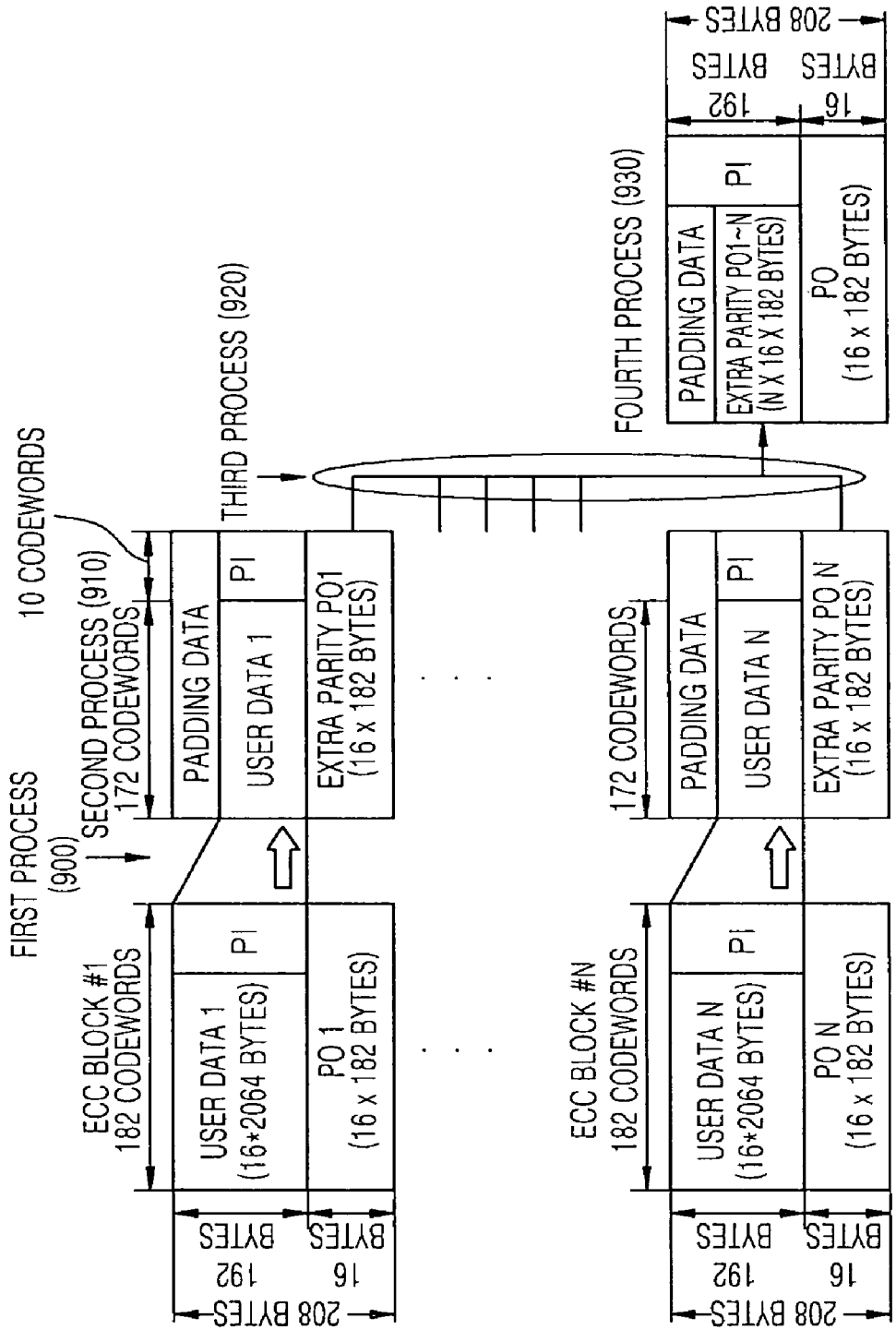
FIG. 9 is a view explaining an extra parity ECC block generating process based on FIG. 8 according to an embodiment of the present invention.

FIG. 9 is a view explaining an extra parity ECC block generating process based on FIG. 8 according to an embodiment of the present invention, in which an ECC block has an RSPC format. As illustrated in a first process 900 of FIG. 9, the extra data block generating unit 810 generates N number of extra data blocks based on a portion of data of the N number of ECC blocks (ECC blocks #1 through #N). The portion of the data may be data (USER DATA #1 through #N) included in each ECC block except for parity inner (PI) and parity outer (PO) parities as illustrated in FIG. 9 or, although not illustrated in FIG. 9, data included in each ECC block except for a PO parity.

In other words, the extra data block generating unit 801 generates an extra data block (172 columns×96 rows) using 96 even-numbered rows (0, 2, 4, through to 190) of a portion of data (172 columns×192 rows) not including PI and PO parities of an ECC block (182 columns×208 rows) as illustrated in FIG. 9. The extra data block generating unit 801 may also generate an extra data block (182 columns×96 rows) using 96 even-numbered rows (0, 2, 4, through to 190) of a portion of data (182 columns×192 rows) not including a PO parity of an ECC block (182 columns×208 rows). It is understood that the extra data block may be generated using odd-numbered rows of the portion of the data, every $I^{th}$ row of the portion of the data (e.g., every third or fourth row) where I is an integer greater than 2, or every plurality of rows (or codewords) of the portion of the data.

If the extra data block generating unit 801 generates N number of extra data blocks that are 172 columns×96 rows, the extra ECC block generating unit 802 adds extra parity information to each of the N number of extra data blocks in a second process 910, thereby generating N number of extra ECC blocks. In other words, the extra data block generating unit 801 generates an extra ECC block that is 182 columns× 112 rows by adding a PI parity of 10 bytes and a PO parity of 16 bytes to an extra data block that is 172 columns×96 rows. If the extra data block generating unit 801 generates N number of extra data blocks that are 182 columns×96 rows, the extra ECC block generating unit 802 generates N number of extra ECC blocks that are 182 columns×112 rows by adding a PO parity of 16 bytes to each of the N number of extra data blocks.

In the generation of an extra ECC block, the extra ECC block generating unit 802 may add padding data to an extra data block as illustrated in FIG. 9, so that the format of the extra ECC block is the same as the format of an ECC block. The padding data has a predefined value.

The extra parity data block generating unit 803 generates an extra parity data block based on extra parity information included in the N number of extra ECC blocks generated by the extra ECC block generating unit 802. In FIG. 9, extra parities PO1 through PON included in the N number of extra ECC blocks are interleaved in a third process 930 in order to generate an extra parity data block. At this time, the extra parity data block generating unit 803 may add padding data to data obtained by the interleaving, so that the format of the generated parity data block can be the same as the format of a user data block of an ECC block. The padding data has a predefined value.

Since the interleaving influences a data decoding performance, the interleaving is performed in order to cause the extra parity information of the N number of extra ECC blocks to be distributed uniformly. In other words, the interleaving may be performed on the extra parity information in a manner that a piece of data is extracted from every Mth piece of data having a constant length, where M is an integer that is greater than or equal to 2. The constant length is a product of K and the number of pieces of data in an ECC block that correspond to a unit to which a synchronization signal is assigned, where K is an integer that is greater than or equal to 1. In other words, in extra parity information (r columns×s bytes), s bytes may be divided into p columns and the interleaving may be performed in units of (r×p) columns×s/p bytes. For example, p may be set to 2 in the case of a DVD in which r=182 and s=16 and in the case of a Blu-ray disc (BD) in which r=384 and s=32.

The interleaving may be performed based on a unit having a constant length in order to alternately extract (r×p/k) columns×1 byte from N number of pairs of extra parities of (r×p) columns×s/p bytes.

In other words, the extra parity data block generating unit 803 performs interleaving on the extra parity information included in the N number of extra ECC blocks in units of at least one row or a plurality of rows or 91 columns×16 bytes of 182 columns×16 bytes in order to generate an extra parity data block of N×16×182 bytes in a fourth process 930.

When the extra parity data block generating unit 803 generates an extra parity data block, the extra parity ECC block generating unit 804 adds parity information (PO, PI) to an extra parity data block in a fourth process 930, thereby generating at least one parity ECC block for N number of ECC blocks.

Figure 10:
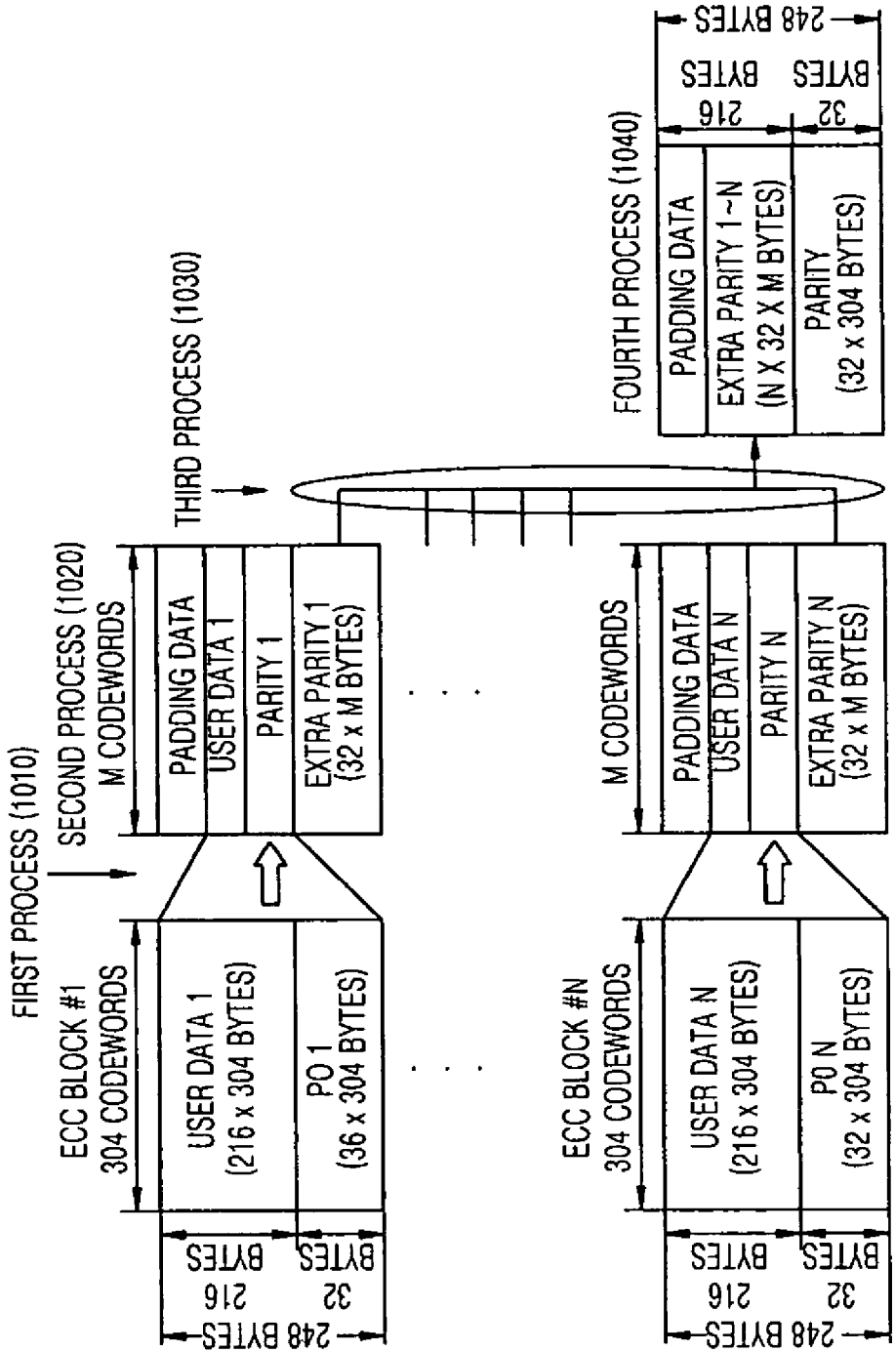
FIG. 10 is a view explaining an extra parity ECC block generating process based on FIG. 8 according to another embodiment of the present invention.

The extra parity ECC block generating unit 110 illustrated in FIG. 8 can be implemented so as to generate at least one extra parity ECC block for N number of ECC blocks as illustrated in FIG. 10. FIG. 10 is a view explaining an extra parity ECC block generating process based on FIG. 8 according to another embodiment of the present invention, in which an ECC block has a BD ECC block format.

In other words, the extra data block generating unit 801 of FIG. 8 generates N number of extra data blocks based on the entire data of the N number of ECC blocks in a first process 1010 shown in FIG. 10. The extra data block generating unit 801 generates an extra data block (304 columns×124 rows) using 124 even-numbered rows (0, 2, 4, through to 246) of an ECC block (304 columns×248 rows).

In a second process 1020, the extra ECC block generating unit 802 adds an extra parity to each extra data block in order to generate N number of extra ECC blocks. In other words, the extra ECC block generating unit 802 adds a parity of 32 bytes to each extra data block of 304 columns×124 rows, thereby generating N number of extra ECC blocks of 304 columns×156 rows.

The extra parity data block generating unit 803 generates an extra parity data block based on extra parity information included in the generated N number of extra ECC blocks. In other words, the extra parity data block generating unit 803 performs interleaving on the extra parity information included in the N number of extra ECC blocks in order to generate the extra parity data block in a third process 1030 of FIG. 10. The interleaving may be performed in the same manner as described with reference to FIG. 9.

In a fourth process 1040, the extra parity ECC block generating unit 804 adds parity information PARITY to an extra parity data block in order to generate an extra parity ECC block. At this time, as illustrated in FIG. 10, the extra parity ECC block generating unit 804 may add padding data to the extra parity data block, so that the format of the extra parity ECC block is the same as the format of an ECC block.

Figure 11:
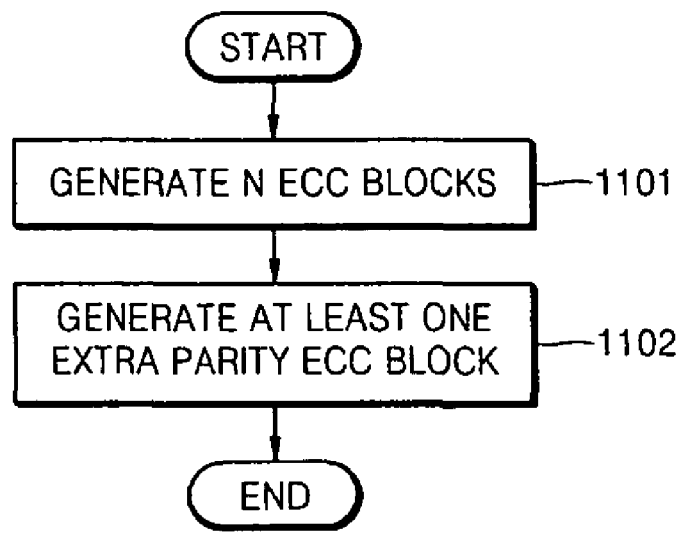
FIG. 11 is a flowchart illustrating a data encoding method according to an embodiment of the present invention.

FIG. 11 is a flowchart illustrating a data encoding method according to an embodiment of the present invention. Referring to FIG. 11, N number of ECC blocks are generated for user data in operation 1101. The generation of the N number of ECC blocks is already described with reference to FIG. 1. In operation 1102, at least one extra parity ECC block is generated for the N number of ECC blocks. Hereinafter, the generation of the extra parity ECC block will be described with reference to FIG. 12.

Figure 12:
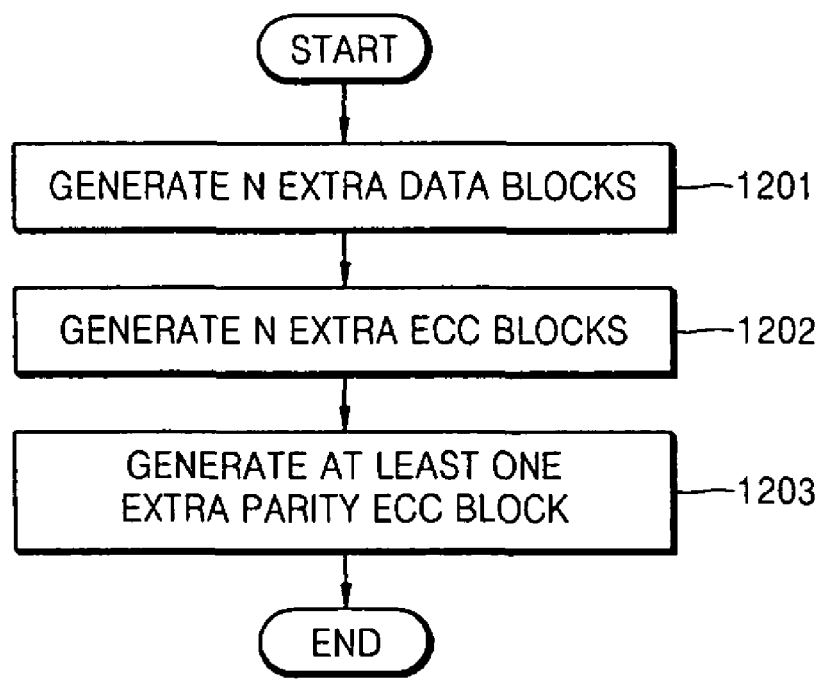
FIG. 12 is a detailed flowchart illustrating an operation of generating an extra parity ECC block illustrated in FIG. 11 according to an embodiment of the present invention.

FIG. 12 is a detailed flowchart illustrating an operation of generating the extra parity ECC block (operation 1102) illustrated in FIG. 11. Referring to FIG. 12, block interleaving is performed on user data blocks of adjacent ECC blocks among the generated N number of ECC blocks in order to generate N number of extra data blocks in operation 1201. The adjacent ECC blocks are immediately adjacent ECC blocks as illustrated in FIGS. 3, 4, 6, and 7. The block interleaving can be performed in units of at least one row.

In operation 1202, N number of extra ECC blocks are generated based on extra parity information and the generated N number of extra data blocks. The extra parity information may include N number of pairs of extra parity information.

At least one extra parity ECC block is generated based on the extra parity information included in the generated N number of extra ECC blocks in operation 1203. The N number of extra ECC blocks and the extra parity ECC block have the same format as that of the ECC block.

According to the flowchart of FIG. 12, at least one extra parity ECC block for N number of ECC blocks can be generated in a manner as illustrated in FIGS. 9 and 10. In other words, in operation 1201, N number of extra data blocks are generated based on a portion of or the entire data of the N ECC blocks as described with reference to FIG. 8. In operation 1202, extra parity information is added to each of the N number of extra data blocks in order to generate N number of extra ECC blocks. In operation 1203, extra parity information included in the N number of extra ECC blocks is interleaved in order to generate an extra parity data block and parity information is added to the generated extra parity data block in order to generate at least one extra parity ECC block.

Figure 13:
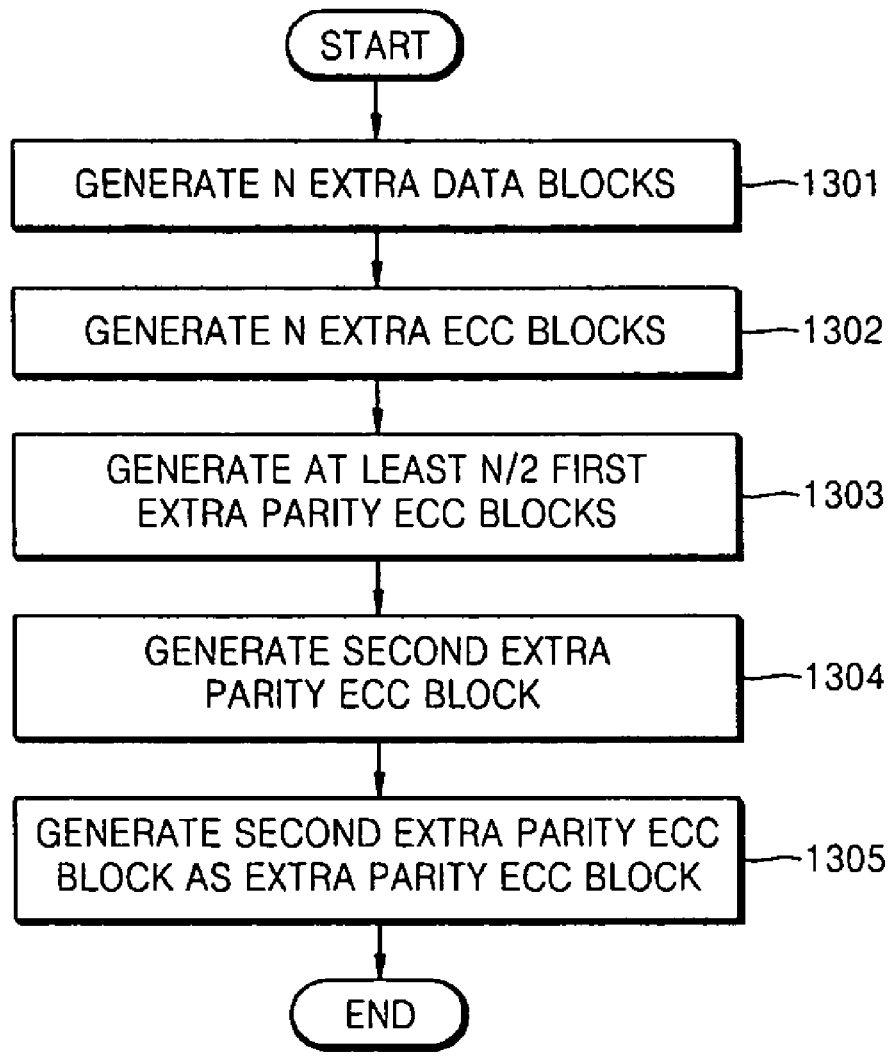
FIG. 13 is another detailed flowchart illustrating an operation of generating an extra parity ECC block illustrated in FIG. 11 according to another embodiment of the present invention.

FIG. 13 is a detailed flowchart illustrating an operation of generating the extra parity ECC block illustrated in FIG. 11 according to another embodiment of the present invention. Referring to FIG. 13, in operation 1301, block interleaving is performed on user data blocks of adjacent ECC blocks among the generated N number of ECC blocks in order to generate N number of extra data blocks. In operation 1302, N number of extra ECC blocks are generated based on extra parity information and the generated N number of extra data blocks.

In operation 1303, at least N/2 number of first extra parity ECC blocks are generated based on the extra parity information included in the generated N number of extra ECC blocks.

In operation 1304, block interleaving is performed on the extra parity information included in the N/2 number of first extra parity ECC blocks in order to generate at least one second extra parity ECC block.

In operation 1305, the generated second extra parity ECC block is generated as at least one extra parity ECC block.

Figure 14:
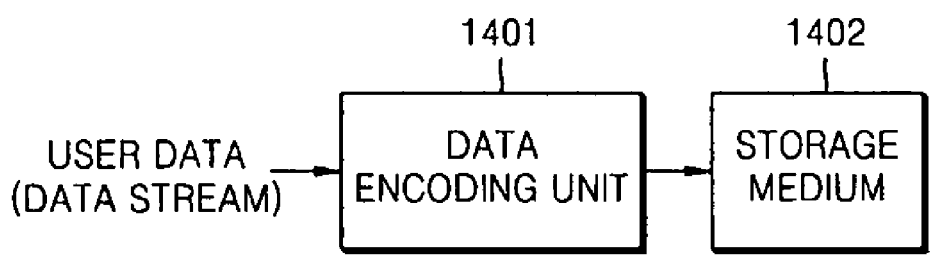
FIG. 14 is a block diagram of a system to drive a storage medium according to an embodiment of the present invention.

FIG. 14 is a block diagram of a system to drive a storage medium according to another embodiment of the present invention. Referring to FIG. 14, the system includes a data encoding unit 1401 configured as in FIG. 1 and a storage medium 1402.

The data encoding unit 1401 generates N number of ECC blocks for user data and generates at least one extra parity ECC block for the N number of ECC blocks.

The storage medium 1402 stores the N number of ECC blocks and the extra parity ECC block that are generated by the data encoding unit 1401. The storage medium 1402 may be a hard disk, a digital versatile disc (DVD), a high-definition (HD)-DVD, or a Blu-ray disc, for example. Other types of storage media may also be used.

If the system of FIG. 14 is a disc drive connected to a host (not shown), it is activated upon receiving a data recording request from the host (not shown) and can record the N number of ECC blocks and the extra parity ECC block in the storage medium 1402. At this time, the system may internally generate the extra parity ECC block. However, it is understood that the host may generate the extra parity ECC block by communicating with the system and then the system can receive the extra parity ECC block and record the received extra parity ECC block in the storage medium 1403.

Figure 15:
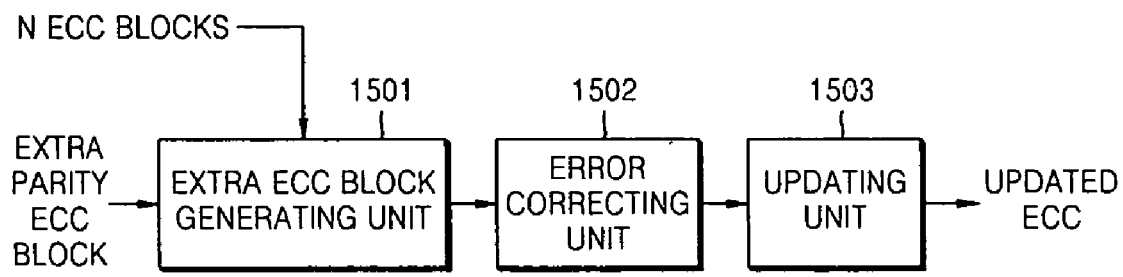
FIG. 15 is a block diagram of a data decoder according to an embodiment of the present invention.

FIG. 15 is a block diagram of a data decoder according to an embodiment of the present invention. Referring to FIG. 15, the data decoder includes an extra ECC block generating unit 1501, an error correcting unit 1502, and an updating unit 1503.

The extra ECC block generating unit 1501 detects an extra parity data block from an extra parity ECC block. The detection uses information stored when parity information is added to the extra parity data block. For example, position information used in adding parity information to the extra parity data block may be used for the detection.

The extra ECC block generating unit 1501 generates N number of extra ECC blocks based on the detected extra parity data block and a user data block of each of the N number of ECC blocks. The generation of the N number of extra ECC blocks may be partially performed in a reverse way to that described with reference to FIGS. 3, 4, 6, 7, 9, and 10. In particular, in FIGS. 9 and 10, extra parity information for the N number of extra ECC blocks may be detected by de-interleaving the detected extra parity data block.

The error correcting unit 1502 performs error correction on the N number of extra ECC blocks.

The updating unit 1503 updates a user data block included in an ECC block that still has errors, from among the N number of extra ECC blocks, based on an extra data block included in the N number of extra ECC blocks that have undergone error correction.

Figure 16:
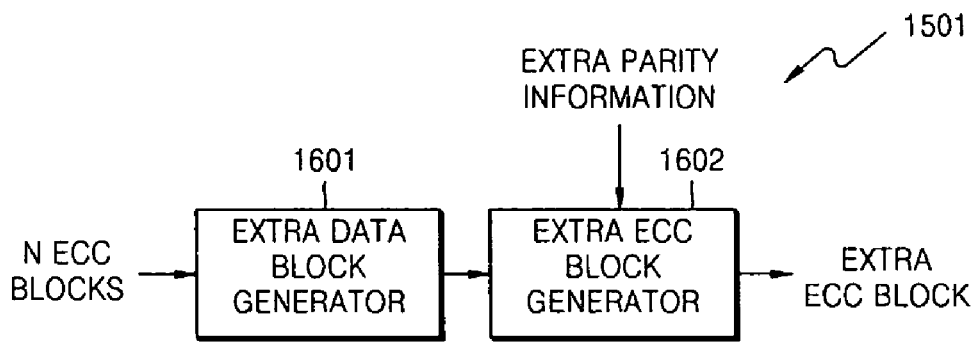
FIG. 16 is a detailed block diagram of an extra ECC block generating unit of FIG. 15.

FIG. 16 is a detailed block diagram of the extra ECC block generating unit 1501 of FIG. 15. Referring to FIG. 16, the extra ECC block generating unit 1501 includes an extra data block generator 1601 and an extra ECC block generator 1602.

The extra data block generator 1601 performs block interleaving on user data blocks of adjacent ECC blocks among the generated N number of ECC blocks in order to generate N number of extra data blocks. However, it is understood that the extra data block generator 1601 may be implemented so as to generate N number of extra data blocks based on a portion of or on the entire data of the N number of ECC blocks.

The extra ECC block generator 1602 generates the N number of extra ECC blocks by adding extra parity information to the N number of extra data blocks.

Figure 17:
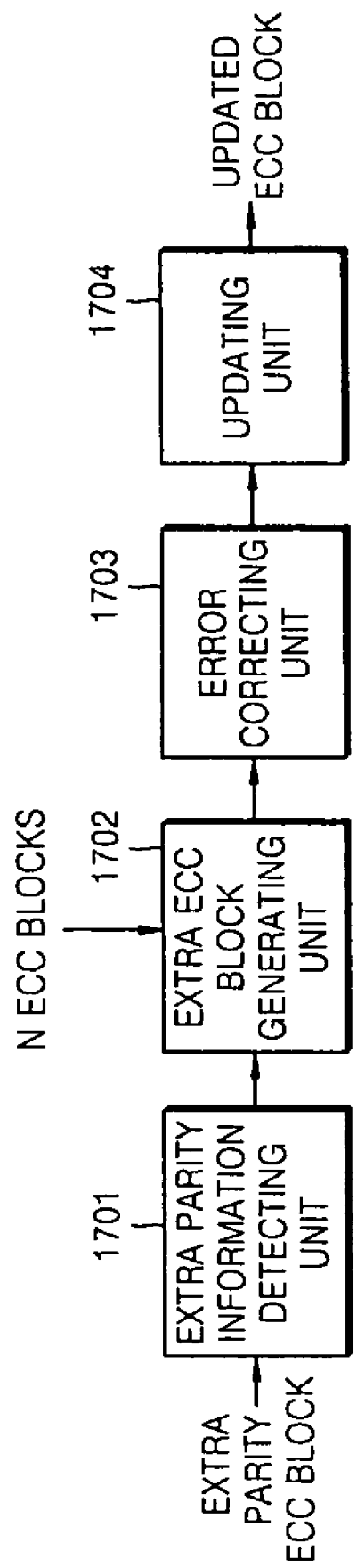
FIG. 17 is a block diagram of a data decoder according to another embodiment of the present invention.

FIG. 17 is a block diagram of a data decoder according to another embodiment of the present invention. Referring to FIG. 17, the data decoder includes an extra parity data block detecting unit 1701, an extra ECC block generating unit 1702, an error correcting unit 1703, and an updating unit 1704.

The extra parity data block detecting unit 1701 detects an extra parity data block from an input extra parity ECC block. The detection may be performed as described regarding the extra ECC block generating unit 1501 of FIG. 15.

The extra ECC block generating unit 1702 generates N number of extra ECC blocks based on the detected extra parity data block and user data of the N number of ECC blocks or a portion of or the entire data of the N number of ECC blocks.

The error correcting unit 1703 and the updating unit 1704 have the same configurations as and operate in the same manner as the error correcting unit 1502 and the updating unit 1503 of FIG. 15.

When the data decoder of FIGS. 15 and 17 is applied to a system to drive a storage medium, an extra parity ECC block and N number of ECC blocks are data read from the storage medium and an updated ECC block is data reproduced from the system. When the data decoder of FIGS. 15 and 17 is applied to a network or a wireless/wired communication system, an extra parity ECC block and N number of ECC blocks are data transmitted from a reception side and an updated ECC block is reproduced data.

Figure 18:
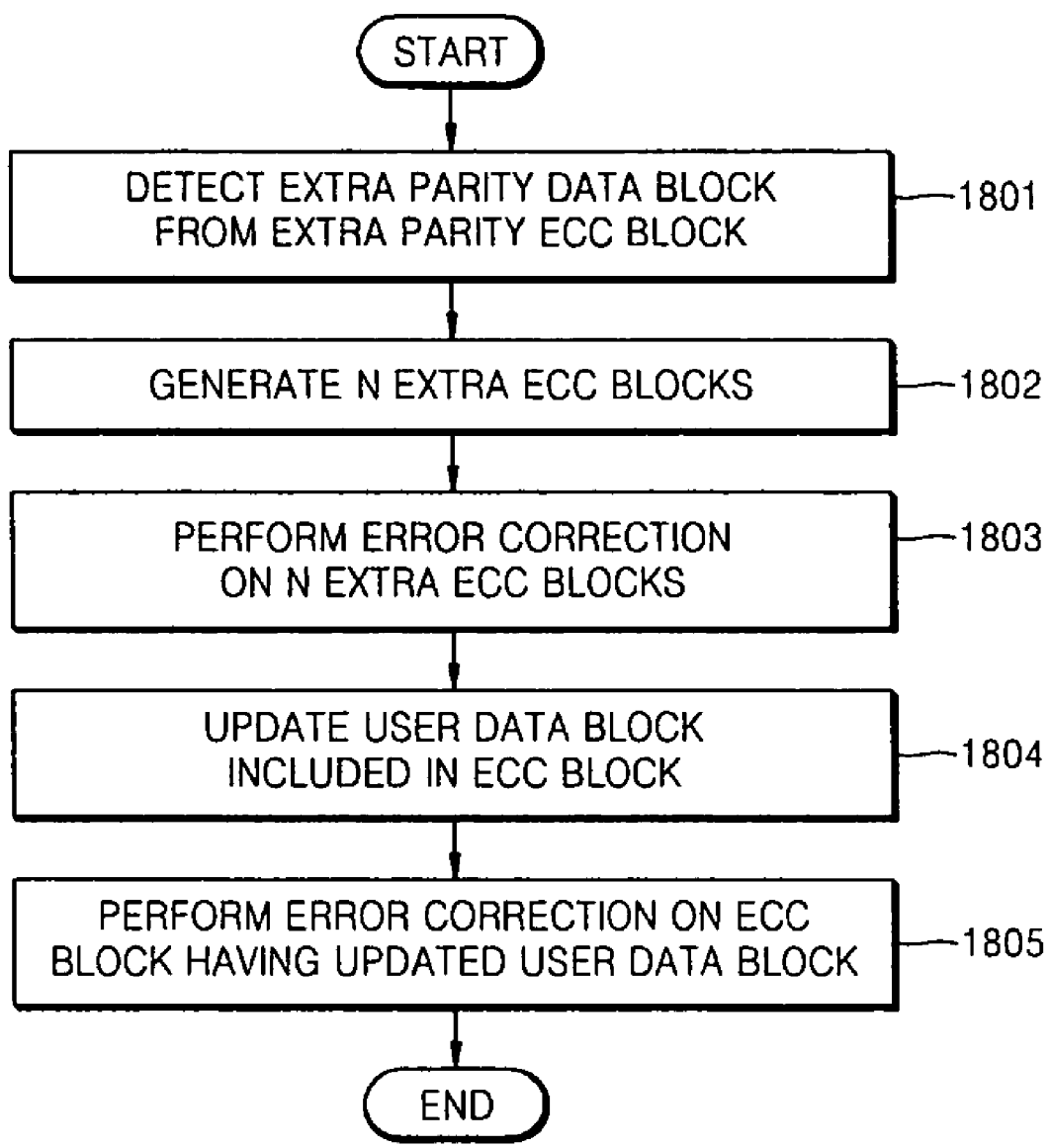
FIG. 18 is a flowchart illustrating a data decoding method according to an embodiment of the present invention.

FIG. 18 is a flowchart illustrating a data decoding method according to an embodiment of the present invention. Referring to FIG. 18, an extra parity data block is detected from an extra parity ECC block in operation 1801.

In operation 1802, N number of extra ECC blocks are generated based on a user data block of each of the N number of ECC blocks and the extra parity data block. At this time, if the extra parity data block is generated as shown in FIGS. 9 and 10, the detected extra parity data block is de-interleaved and is added to the N number of extra ECC blocks as extra parity information.

In operation 1803, the N number of extra ECC blocks undergo error correction. A user data block of an extra ECC block that still has errors is updated based on an extra data block included in the N number of extra ECC blocks that have undergone error correction, in operation 1804.

The ECC block having the updated user data block undergoes error correction in operation 1805.

Figure 19:
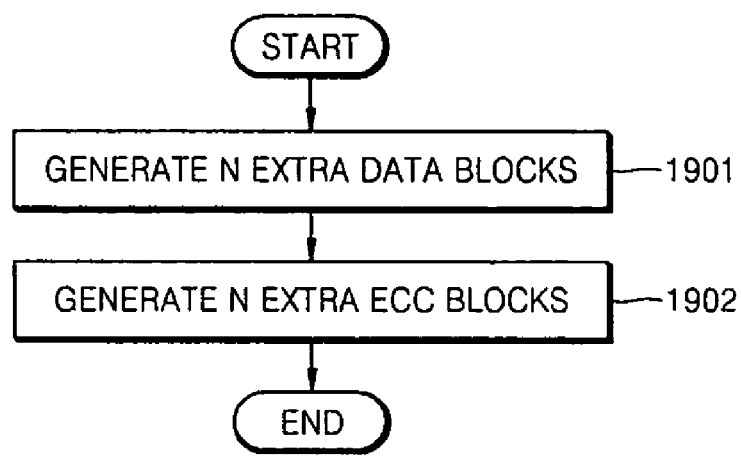
FIG. 19 is a detailed flowchart illustrating an operation of generating an extra ECC block illustrated in FIG. 18.

FIG. 19 is a detailed flowchart illustrating an operation of generating an extra ECC block illustrated in FIG. 18. Referring to FIG. 19, block interleaving is performed on user data blocks of adjacent ECC blocks among the N number of ECC blocks in order to generate N number of extra data blocks in operation 1901. In operation 1902, the N number of extra ECC blocks are generated based on the N number of extra data blocks and the extra parity data block.

Figure 20:
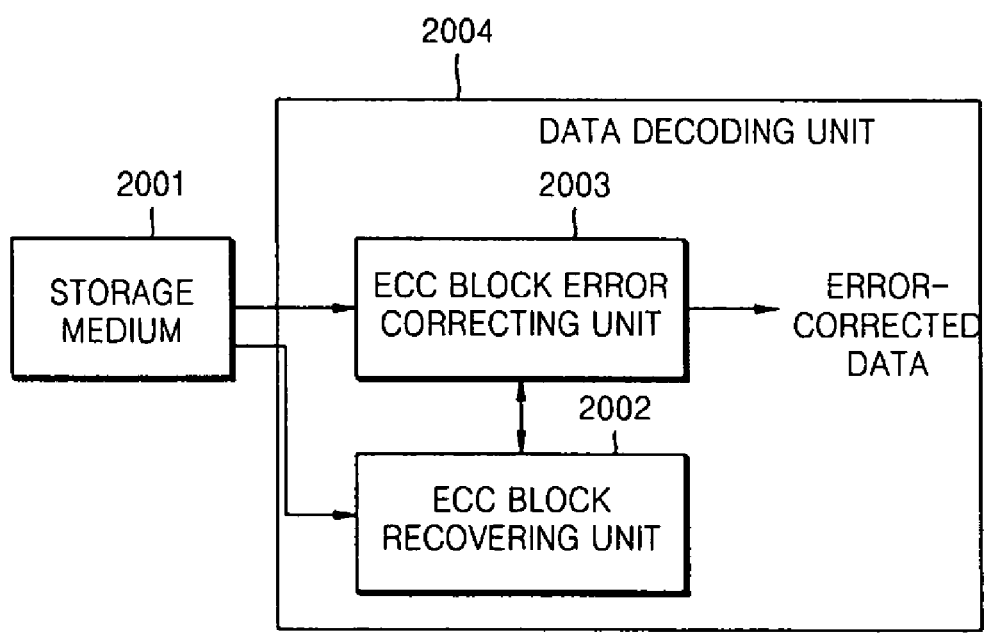
FIG. 20 is a block diagram of a system to drive a storage medium according to another embodiment of the present invention.

FIG. 20 is a block diagram of a system to drive a storage medium according to another embodiment of the present invention. Referring to FIG. 20, the system includes a storage medium 2001, an ECC block recovering unit 2002, and an ECC block error correcting unit 2003.

The storage medium 2001 stores at least N number of ECC blocks and at least one extra parity ECC block corresponding to the N number of ECC blocks. The storage medium 2001 may be the same as the storage medium 1402 of FIG. 14.

The ECC block recovering unit 2002 recovers ECC blocks that still have errors based on the N number of ECC blocks and at least one extra parity ECC block read from the storage medium 2001. The recovery of the ECC block includes detecting an extra parity data block from an extra parity ECC block and updating a user data block of the ECC block in the data decoding method. Thus, the ECC block recovering unit 2002 may be configured as illustrated in FIG. 15 or 17.

When the ECC blocks that still have errors are recovered, information used in recording is used as information about the positions, in the storage medium 2001, of the ECC blocks and the extra parity ECC blocks including an extra parity data block. In other words, when the ECC blocks and the extra parity ECC blocks are recorded in the storage medium 1402 in the system of FIG. 14, the extra parity ECC blocks for ECC blocks recorded from PSN #A to PSN #B are recorded from PSN #C to PSN #D. Thus, when the ECC blocks are recovered, the extra parity ECC blocks corresponding to the ECC blocks that still have errors can be, accordingly, read from the storage medium 1801.

The ECC block error correcting unit 2003 performs error correction on one of an ECC block read from the storage medium 2001 and ECC blocks transmitted from the ECC block recovering unit 2002. In other words, the ECC block error correcting unit 2003 performs error correction on the ECC blocks transmitted from the storage medium 2001 and outputs error-corrected data. At this time, if an ECC block still has errors, the ECC block error correcting unit 2003 requests the ECC block recovering unit 2002 to recover the ECC block. Thus, the ECC block recovering unit 2002 recovers the ECC block that still has errors by updating a user data block of the ECC block using the ECC block, ECC blocks adjacent to the ECC block, and an extra parity ECC block.

The ECC block recovering unit 2002 and the ECC block error correcting unit 2003 illustrated in FIG. 20 may be defined as a data decoding unit 2004. The data decoding unit 2004 includes a data decoder according to an embodiment of the present invention.

As described above, according to aspects of the present invention, a conventional standardized ECC block and an extra parity ECC block that is compatible with the standardized ECC block are generated in data encoding, and a user data block of an ECC block that has errors is recovered using the extra parity ECC block during data decoding. Therefore, an error correction failure rate is minimized with respect to data reproduced in a system for driving a storage medium or a data communication system which performs error correction based on an ECC block and the reliability of the reproduced data is thus improved.

For example, in the case of a DVD RSPC, the length of a burst error that can be error corrected is about 16 rows. However, when the present invention is applied, even if errors having a length of 32 rows occur, a user data block included in a corresponding ECC block can be recovered and the ECC block can be error corrected, thereby minimizing an error correction failure rate with respect to data reproduced in a system to drive a storage medium and thus improving the reliability of the reproduced data.

A program to implement the data encoding and decoding method and the operation of generating an extra parity ECC block according to the present invention can also be embodied as a computer-readable code on a computer-readable recording medium. The computer-readable recording medium is any data storage device that can store data which can be thereafter read by a computer system. Examples of computer-readable recording media include read-only memory (ROM), random-access memory (RAM), CD-ROMs, magnetic tapes, floppy disks, optical data storage devices, and a computer data signal embodied in a carrier wave including a compression source code segment and an encryption source code segment. The computer-readable recording medium can also be distributed over a network of coupled computer systems so that the computer-readable code is stored and executed in a decentralized fashion.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A data encoding method, comprising:
   generating N number of error correction code (ECC) blocks with respect to user data, N being a predetermined value; and
   generating at least one extra parity ECC block, comprising:
      generating N number of extra data blocks from data of ECC blocks among the generated N number of ECC blocks;
      generating N number of extra ECC blocks including extra parity information, the generating of the N number of extra ECC blocks comprising adding the extra parity information to the generated N number of extra data blocks; and
      generating the at least one extra parity ECC block based on the extra parity information included in the generated N number of extra ECC blocks,
   wherein at least one of the generating of the N number of ECC blocks and the generating of the at least one extra parity ECC block is performed by hardware or a combination of hardware and software.

2. The method as claimed in clam 1, wherein the extra parity information includes N number of pairs of extra parity information.

3. The method as claimed in claim 1, wherein the generating of the N number of extra data blocks comprises:
performing block interleaving on user data blocks of adjacent ECC blocks from among the generated N number of ECC blocks.

4. The method as claimed in claim 3, wherein the performing of the block interleaving on the user data blocks comprises:
performing the block interleaving in units of at least one row.

5. The method as claimed in claim 2, wherein the generated N number of extra ECC blocks and the generated at least one extra parity ECC block have a format that is the same as a format of the generated N number of ECC blocks.

6. The method as claimed in claim 1, wherein the generating of the N number of extra data blocks comprises:
generating the N number of extra data blocks from a portion of data of the generated N number of ECC blocks.

7. The method as claimed in claim 6, wherein the portion of the data is included in the generated N number of ECC blocks except for a parity inner (PI) parity and/or a parity outer (PO) parity.

8. The method as claimed in claim 1, wherein the generating of the at least one extra parity ECC block comprises:
generating an extra parity data block, comprising interleaving the extra parity information included in the generated N number of extra ECC blocks; and
adding parity information to the extra parity data block to generate the at least one extra parity ECC block.

9. The method as claimed in claim 8, wherein the interleaving of the extra parity information is performed on the extra parity information such that one piece of data is extracted from every Mth piece of data having a constant length and M is an integer that is greater than or equal to 2.

10. The method as claimed in claim 9, wherein the constant length is a product of a number of pieces of data in an ECC block that corresponds to a unit to which a synchronization signal is assigned and K, where K is an integer that is greater than or equal to 1.

11. The method as claimed in claim 8, wherein the generated at least one extra parity ECC block has a format that is the same as a format of the generated N number of ECC blocks.

12. The method as claimed in claim 8, wherein the generated extra parity data block includes padding data having a predefined value.

13. The method as claimed in claim 1, wherein the generating of the N number of extra data blocks comprises:
generating the N number of extra data blocks from an entirety of data of the generated N number of ECC blocks.

14. The method as claimed in claim 1, wherein the generated N number of extra data blocks each includes padding data having a predefined value.

15. A data encoding method, comprising:
generating N number of error correction code (ECC) blocks with respect to user data, N being a predetermined value; and
generating at least one extra parity ECC block, comprising:
generating N number of extra data blocks from user data blocks of the generated N number of ECC blocks;
generating N number of extra ECC blocks including first extra parity information, the generating of the N number of extra ECC blocks comprising adding the first extra parity information to the generated N number of extra data blocks;
generating at least N/2 number of first extra parity ECC blocks including second extra parity information, the generating of the at least N/2 number of first extra parity ECC blocks being based on the first extra parity information included in the generated N number of extra ECC blocks; and
generating at least one second extra parity ECC block based on the second extra parity information included in the generated at least N/2 number of first extra parity ECC blocks,
wherein the generated at least one second extra parity ECC block is the at least one extra parity ECC block, and
wherein at least one of the generating of the N number of ECC blocks and the generating of the at least one extra parity ECC block is performed by hardware or a combination of hardware and software.

16. The method as claimed in claim 15, wherein the first extra parity information and the second extra parity information include N pairs of extra parity information.

17. The method as claimed in claim 15, wherein the generating of the N number of extra data blocks comprises:
performing block interleaving on the user data blocks of adjacent ECC blocks from among the generated N number of ECC blocks.

18. The method as claimed in claim 17, wherein the performing of the block interleaving on the user data blocks comprises performing the block interleaving in units of at least one row.

19. The method as claimed in claim 15, wherein the generating of the at least one second extra parity ECC block comprises performing block interleaving on the first extra parity information included in the generated at least N/2 number of first extra parity ECC blocks.

20. The method as claimed in claim 15, wherein the generated N number of extra ECC blocks and the generated at least one extra parity ECC block have a format that is the same as a format of the generated N number of ECC blocks.

21. The method as claimed in claim 15, wherein the generating of the at least one second extra parity ECC block comprises:
generating an extra parity data block, comprising interleaving the second extra parity information included in the generated at least N/2 number of first extra parity ECC blocks; and
adding parity information to the extra parity data block to generate the at least one second extra parity ECC block.

22. The method as claimed in claim 21, wherein the generated at least one second extra parity ECC block has a format that is the same as a format of the generated N number of ECC blocks.

23. The method as claimed in claim 15, wherein the generated N number of extra data blocks each includes padding data having a predefined value.

24. The method as claimed in claim 21, wherein the generated extra parity data block includes padding data having a predefined value.

25. A data encoder, comprising:
an error correction code (ECC) block generating unit configured to generate N number of ECC blocks for user data, N being a predetermined value; and
an extra parity ECC block generating unit configured to generate at least one extra parity ECC block for the generated N number of ECC blocks, the extra parity ECC block generating unit comprising:
an extra data block generator configured to generate N number of extra data blocks from data of ECC blocks among the generated N number of ECC blocks;
an extra ECC block generator configured to add extra parity information to the generated N number of extra data blocks to generate N number of extra ECC blocks, the generated N number of extra ECC blocks including the extra parity information; and an extra parity ECC block generator configured to generate the at least one extra parity ECC block based on the extra parity information included in the generated N number of extra ECC blocks.

26. The data encoder as claimed in claim 25, wherein the extra data block generator is configured to perform block interleaving on user data blocks of adjacent ECC blocks from among the generated N number of ECC blocks to generate the N number of extra data blocks.

27. The data encoder as claimed in claim 26, wherein the extra data block generator is configured to perform the block interleaving in units of at least one row.

28. The data encoder as claimed in claim 25, wherein the generated N number of extra ECC blocks and the generated at least one extra parity ECC block have a format that is the same as a format of the generated N number of ECC blocks.

29. The data encoder as claimed in claim 25, wherein the extra data block generator is configured to generate the N number of extra data blocks based on a portion of data of the generated N number of ECC blocks.

30. The data encoder as claimed in claim 25, wherein the extra parity ECC block generating unit further comprises:

an extra parity data block generator configured to generate at least one extra parity data block based on the extra parity information included in the generated N number of extra ECC blocks, wherein the extra parity ECC block generating unit is configured to add parity information to the generated at least one extra parity data block to generate the at least one extra parity ECC block.

31. The data encoder as claimed in claim 30, wherein the extra parity data block generator is configured to interleave the extra parity information included in the generated N number of extra ECC blocks to generate the at least one extra parity data block.

32. The data encoder as claimed in claim 25, wherein the extra data block generator is configured to generate the N number of extra data blocks based on an entirety of data of the generated N number of ECC blocks.

33. A data encoder, comprising:

an error correction code (ECC) block generating unit configured to generate N number of ECC blocks for user data, N being a predetermined value; and an extra parity ECC block generating unit configured to generate at least one extra parity ECC block for the generated N number of ECC blocks, the extra parity ECC block generating unit comprising:

an extra data block generator configured to generate N number of extra data blocks from user data blocks of the generated N number of ECC blocks;

an extra ECC block generator configured to add first extra parity information to the generated N number of extra data blocks to generate N number of extra ECC blocks, the generated N number of extra ECC blocks including the first extra parity information;

a first extra parity ECC block generator configured to generate at least N/2 number of first extra parity ECC blocks including second extra parity information, the generated at least N/2 number of first extra parity ECC blocks being based on the first extra parity information included in the generated N number of extra ECC blocks; and a second extra parity ECC block generator configured to generate at least one second extra parity ECC block as the at least one extra parity ECC block based on the second extra parity information included in the generated at least N/2 number of first extra parity ECC blocks.

34. The data encoder as claimed in claim 33, wherein the second extra parity ECC block generator is configured to perform block interleaving on the second extra parity information included in the generated at least N/2 number of first extra parity ECC blocks to generate the at least one second extra parity ECC block.

35. The data encoder as claimed in claim 33, wherein the extra data block generator is configured to perform block interleaving on the user data blocks of adjacent ECC blocks from among the generated N number of ECC blocks to generate the N number of extra data blocks.

36. The data encoder as claimed in claim 35, wherein the extra data block generator is configured to perform the block interleaving in units of at least one row.

37. The data encoder as claimed in claim 33, wherein the generated N number of extra ECC blocks and the generated at least one extra parity ECC block have a format that is the same as a format of the generated N number of ECC blocks.

38. A data decoding method, comprising:

generating N number of extra ECC blocks using user data blocks of N number of ECC blocks and an extra parity data block included in an at least one extra parity ECC block, N being a predetermined value;

performing error correction on the generated N number of extra ECC blocks; and updating a user data block of an ECC block of the N number of ECC blocks, the updated of the user data block of the ECC block being based on extra data blocks of N number of extra data blocks included in the generated N number of extra ECC blocks that have undergone error correction.

39. The data decoding method as claimed in claim 38, wherein the generating of the N number of extra ECC blocks comprises:

generating the N number of extra data blocks, comprising performing block interleaving on the user data blocks of adjacent ECC blocks from among the N number of ECC blocks; and generating the N number of extra ECC blocks from the generated N number of extra data blocks and the extra parity data block.

40. The data decoding method as claimed in claim 38, wherein the ECC block having the updated user data block has errors before the updating of the user data block.

41. The data decoding method as claimed in claim 38, wherein the generating of the N number of extra ECC blocks comprises:

generating the N number of extra data blocks based on a portion of or an entirety of data of the N number of ECC blocks; and generating the N number of extra ECC blocks from the generated N number of extra data blocks and the extra parity data block.

42. The data decoding method as claimed in claim 38, wherein the generating of the N number of extra ECC blocks comprises de-interleaving the extra parity data block.

* * * * *